(12) United States Patent
Abrams et al.

(10) Patent No.: US 7,788,627 B2
(45) Date of Patent: Aug. 31, 2010

(54) LITHOGRAPHY VERIFICATION USING GUARD BANDS

(75) Inventors: Daniel S. Abrams, Mountain View, CA (US); Christopher James Ashton, Campbell, CA (US)

(73) Assignee: Luminescent Technologies, Inc., Palo Alto, CA (US)

(*) Notice: Subject to any disclaimer, the term of this patent is extended or adjusted under 35 U.S.C. 154(b) by 255 days.

(21) Appl. No.: 11/538,290

(22) Filed: Oct. 3, 2006

(65) Prior Publication Data

US 2007/0184369 A1 Aug. 9, 2007

Related U.S. Application Data

(60) Provisional application No. 60/723,320, filed on Oct. 3, 2005.

(51) Int. Cl.
*G06F 17/50* (2006.01)
(52) U.S. Cl. ............................................. 716/19; 716/21
(58) Field of Classification Search ............. 716/19–21; 430/5, 22, 30
See application file for complete search history.

(56) References Cited

U.S. PATENT DOCUMENTS

| | | | |
|---|---|---|---|
| 4,752,957 A | 6/1988 | Maeda | |
| 5,242,770 A | 9/1993 | Chen et al. | |
| 5,301,101 A | 4/1994 | MacArthur et al. | |
| 5,418,092 A | 5/1995 | Okamoto | |
| 5,489,509 A | 2/1996 | Kawabata et al. | |
| 5,508,803 A | 4/1996 | Hibbs et al. | |
| 5,525,808 A | 6/1996 | Irie et al. | |
| 5,546,189 A | 8/1996 | Svetkoff et al. | |
| 5,546,225 A | 8/1996 | Shiraishi | |
| 5,640,199 A | 6/1997 | Garakani et al. | |
| 5,707,765 A | 1/1998 | Chen | |
| 5,889,678 A | 3/1999 | Inoue et al. | |
| 6,022,644 A | 2/2000 | Lin et al. | |
| 6,042,998 A | 3/2000 | Brueck et al. | |

(Continued)

FOREIGN PATENT DOCUMENTS

WO    WO 2006/078791 A2    7/2006

(Continued)

OTHER PUBLICATIONS

S. Osher and R. P. Fedkiw, "Level set methods: an overview and some recent results", J. Computational Physics, vol. 169, No. 2, pp. 463 May 20, 2001.

(Continued)

*Primary Examiner*—Jack Chiang
*Assistant Examiner*—Binh C Tat
(74) *Attorney, Agent, or Firm*—Wilson Sonsini Goodrich & Rosati

(57) ABSTRACT

A method for verifying a lithographic process is described. During the method, a set of guard bands are defined around a target pattern that is to be printed on a semiconductor die using a photo-mask in the lithographic process. An estimated pattern is calculated using a model of the lithographic process. This model of the lithographic process includes a mask pattern corresponding to the photo-mask and a model of an optical path. Then, whether or not positions of differences between the estimated pattern and the target pattern exceeded one or more guard bands in the set of guard bands is determined.

22 Claims, 5 Drawing Sheets

U.S. PATENT DOCUMENTS

| | | | |
|---|---|---|---|
| 6,096,567 A | 8/2000 | Kaplan et al. | |
| 6,123,733 A | 9/2000 | Dalton | |
| 6,383,847 B1 * | 5/2002 | Ditlow et al. | 438/128 |
| 6,468,711 B1 * | 10/2002 | Sorori et al. | 430/270.1 |
| 6,484,306 B1 | 11/2002 | Bokor et al. | |
| 6,563,566 B2 | 5/2003 | Rosenbluth et al. | |
| 6,596,466 B1 | 7/2003 | Pohland et al. | |
| 6,601,192 B1 | 7/2003 | Bowman-Amuah | |
| 6,611,627 B1 | 8/2003 | LaRossa et al. | |
| 6,617,096 B2 | 9/2003 | Burkhard | |
| 6,677,948 B1 | 1/2004 | Wasserman et al. | |
| 6,698,007 B2 | 2/2004 | Wu et al. | |
| 6,703,170 B1 | 3/2004 | Pindo | |
| 6,704,920 B2 | 3/2004 | Brill et al. | |
| 6,733,929 B2 | 5/2004 | Pierrat | |
| 6,756,980 B2 | 6/2004 | Hayashi | |
| 6,764,795 B2 | 7/2004 | Aton et al. | |
| 6,787,271 B2 | 9/2004 | Cote | |
| 6,795,069 B2 | 9/2004 | Raskar et al. | |
| 6,798,412 B2 | 9/2004 | Cowperthwaite | |
| 6,799,313 B2 | 9/2004 | LaCour | |
| 6,809,797 B2 | 10/2004 | Baselmans et al. | |
| 6,880,135 B2 * | 4/2005 | Chang et al. | 716/4 |
| 6,968,532 B2 | 11/2005 | Sivakumar et al. | |
| 7,027,658 B2 | 4/2006 | Osher et al. | |
| 7,031,538 B2 | 4/2006 | Osher et al. | |
| 7,073,162 B2 | 7/2006 | Cobb et al. | |
| 7,124,394 B1 | 10/2006 | Abrams et al. | |
| 7,175,945 B2 | 2/2007 | Mieher et al. | |
| 7,178,127 B2 | 2/2007 | Abrams et al. | |
| 7,231,628 B2 | 6/2007 | Pack et al. | |
| 7,236,123 B2 | 6/2007 | Siegel | |
| 7,302,090 B2 | 11/2007 | Kalus et al. | |
| 7,353,145 B2 | 4/2008 | Tanaka et al. | |
| 7,403,641 B2 | 7/2008 | Nakamoto et al. | |
| 7,441,227 B2 | 10/2008 | Abrams et al. | |
| 7,480,889 B2 | 1/2009 | Abrams et al. | |
| 7,512,927 B2 * | 3/2009 | Gallatin et al. | 716/19 |
| 7,571,423 B2 | 8/2009 | Abrams et al. | |
| 2002/0028393 A1 | 3/2002 | Laidig et al. | |
| 2002/0066069 A1 | 5/2002 | Ashida et al. | |
| 2002/0177050 A1 | 11/2002 | Tanaka | |
| 2002/0188924 A1 | 12/2002 | Pierrat et al. | |
| 2003/0095267 A1 | 5/2003 | Mieher et al. | |
| 2003/0103189 A1 | 6/2003 | Neureuther et al. | |
| 2003/0106642 A1 | 6/2003 | Fairbairn | |
| 2003/0123707 A1 | 7/2003 | Park | |
| 2003/0140330 A1 | 7/2003 | Tanaka et al. | |
| 2003/0152841 A1 | 8/2003 | Averbukh | |
| 2003/0165749 A1 | 9/2003 | Fritze et al. | |
| 2003/0198872 A1 | 10/2003 | Yamazoe et al. | |
| 2004/0008880 A1 | 1/2004 | Horie et al. | |
| 2004/0021660 A1 | 2/2004 | Ng-Thow-Hing et al. | |
| 2004/0031013 A1 | 2/2004 | Dulman et al. | |
| 2004/0073884 A1 | 4/2004 | Kroyan | |
| 2004/0086792 A1 | 5/2004 | Romeo et al. | |
| 2004/0101766 A1 | 5/2004 | Mesuda et al. | |
| 2004/0136587 A1 | 7/2004 | Kalus et al. | |
| 2004/0147121 A1 | 7/2004 | Nakagaki et al. | |
| 2004/0161678 A1 | 8/2004 | Misaka | |
| 2004/0166422 A1 | 8/2004 | Yamazoe et al. | |
| 2004/0214096 A1 | 10/2004 | Dulman et al. | |
| 2004/0229133 A1 | 11/2004 | Socha et al. | |
| 2004/0265707 A1 | 12/2004 | Socha | |
| 2005/0066300 A1 | 3/2005 | Zach | |
| 2005/0122500 A1 | 6/2005 | Ye et al. | |
| 2005/0136340 A1 | 6/2005 | Baselmans et al. | |
| 2005/0142470 A1 | 6/2005 | Socha et al. | |
| 2005/0147893 A1 | 7/2005 | Ogawa et al. | |
| 2005/0191566 A1 | 9/2005 | Liu et al. | |
| 2005/0251771 A1 * | 11/2005 | Robles | 716/5 |
| 2005/0265605 A1 | 12/2005 | Nakamoto et al. | |
| 2006/0049978 A1 | 3/2006 | Siegel | |
| 2006/0051682 A1 | 3/2006 | Hess et al. | |
| 2006/0172204 A1 | 8/2006 | Peng et al. | |
| 2006/0273242 A1 | 12/2006 | Hunsche et al. | |
| 2007/0009808 A1 | 1/2007 | Abrams et al. | |
| 2007/0011644 A1 | 1/2007 | Abrams et al. | |
| 2007/0011645 A1 | 1/2007 | Abrams et al. | |
| 2007/0011647 A1 | 1/2007 | Abrams et al. | |
| 2007/0011648 A1 | 1/2007 | Abrams | |
| 2007/0026613 A1 | 2/2007 | Ryu et al. | |
| 2007/0133862 A1 | 6/2007 | Gold et al. | |
| 2007/0136716 A1 | 6/2007 | Abrams et al. | |
| 2007/0156327 A1 | 7/2007 | Tipping et al. | |
| 2007/0184357 A1 | 8/2007 | Abrams et al. | |
| 2007/0186206 A1 | 8/2007 | Abrams et al. | |
| 2007/0186208 A1 | 8/2007 | Abrams et al. | |
| 2007/0192756 A1 | 8/2007 | Abrams et al. | |
| 2007/0196742 A1 | 8/2007 | Abrams et al. | |
| 2007/0198963 A1 | 8/2007 | Granik et al. | |
| 2007/0198966 A1 | 8/2007 | Abrams et al. | |
| 2007/0217566 A1 | 9/2007 | Chen et al. | |
| 2009/0013304 A1 | 1/2009 | Peng | |
| 2009/0073413 A1 | 3/2009 | Abrams et al. | |
| 2009/0077526 A1 | 3/2009 | Abrams et al. | |
| 2009/0077527 A1 | 3/2009 | Gergov et al. | |

FOREIGN PATENT DOCUMENTS

| | | | |
|---|---|---|---|
| WO | WO 2006/ 078791 | A3 | 7/2006 |
| WO | WO 2007/ 033362 | A2 | 3/2007 |
| WO | WO 2007/ 033362 | A3 | 3/2007 |
| WO | WO 2007/ 041600 | A2 | 4/2007 |
| WO | WO 2007/ 041600 | A3 | 4/2007 |
| WO | WO 2007/041602 | A2 | 4/2007 |
| WO | WO 2007/041602 | A3 | 4/2007 |
| WO | WO 2007/ 041701 | A2 | 4/2007 |
| WO | WO 2007/ 041701 | A3 | 4/2007 |
| WO | WO 2007/ 044557 | A2 | 4/2007 |
| WO | WO 2007/ 044557 | A3 | 4/2007 |
| WO | WO 2007/ 044630 | A2 | 4/2007 |
| WO | WO 2007/ 044630 | A3 | 4/2007 |
| WO | WO 2007/ 044827 | A2 | 4/2007 |
| WO | WO 2007 /044827 | A3 | 4/2007 |
| WO | WO 2008/ 039674 | A2 | 4/2008 |
| WO | WO 2008/ 039674 | A3 | 4/2008 |
| WO | WO 2009/036364 | A1 | 3/2009 |

OTHER PUBLICATIONS

Nicolas Bailey Cobb, PhD Thesis, "Fast Optical and Process Proximity Correction Algorithms for Integrated Circuit Manufacturing", U.C. Berkeley, Spring 1998.

B.E.A. Saleh and S.I. Sayegh, "Reductions of errors of microphotographic reproductions by optical corrections of original masks", Optical Eng. vol. 20, No. 5 pp. 781-784 (1981).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Y. Liu and A. Zakhor, "Optimal binary image design for optical lithography", Proc. SPIE vol. 1264 pp. 401-412 (1990).

Y. Liu and A. Zakhor, "Binary and phase-shifting image design for optical lithography", Proc. SPIE vol. 1463 pp. 382-399 (1991).

A. Rosenbluth et. al, "Optimum mask and source patterns to print a given shape", JM$^3$ vol. 1 No. 1 pp. 13-30 (2002).

Y-T Wang, Y.C. Pati, H. Watanabe and T. Kailath, "Automated design of halftoned double-exposure phase-shifting masks", Proc. SPIE vol. 2440 pp. 290-301 (1995).

Y.H. Oh, and J-C Lee, "Resolution enhancement through optical proximity correction and stepper parameter optimization for 0.12-μm mask pattern", Proc. SPIE vol. 3679 pp. 607-613 (1999).

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.M. Berg and N. Zhou, "Shape-based optimization of a plasma etching process", 39$^{th}$ IEEE Conf. On Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

Sethian, J.A., "Level set methods and fast marching methods," 1999, Cambridge University Press, pp. 1-33.

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176196.

Wong et al., Massively Parallel Electromagnetic Simulation for Photolithographic Applications, Oct. 1995, IEEE, vol. 14, pp. 1231-1240.

Sethian, J.A., "Level set methods and fast marching methods," 1999, Cambridge University Press, pp. 316-360 (printed from website http://math.berkeley.edu/~sethian/level_set.html).

Khan, M. et al., "A Semi-Empirical Resist Dissolution Model for Sub-micron Lithographics", pp. 41-46, by Technical Proceedings of the 1998 International Conference on Modeling and Simulation of Microsystems, 1998.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Method for Time-Evolving Rectilinear Contours Representing Photo Masks," Response to Restriction Requirement filed Jun. 15, 2009, in U.S. Appl. No. 11/674,133, filed Feb. 12, 2007.

Abrams, Daniel et al., "Mask-Pattern Determination using Topology Types," Nonfinal Office Action mailed Sep. 8, 2009, in U.S. Appl. No. 11/538,420, filed Oct. 3, 2006.

Peng, Danping et al., "Systems, Masks and Methods for Printing Contact Holes and Other Patterns," Nonfinal Office Action mailed Aug. 13, 2008, in U.S. Appl. No. 11/335,018, filed Jan. 18, 2006.

Abrams, Daniel et al., "Mask-Patterns Including Intentional Breaks," Nonfinal Office Action mailed Sep. 19, 2008, in U.S. Appl. No. 11/538,782, filed Oct. 4, 2006.

Abrams, Daniel et al., "Mask-Patterns Including Intentional Breaks," Nonfinal Office Action mailed Jul. 7, 2009, in U.S. Appl. No. 11/538,782, filed Oct. 4, 2006.

Abrams, Daniel et al., "Mask-Patterns Including Intentional Breaks," Response to Office Action filed Jan. 28, 2009, in U.S. Appl. No. 11/538,782, filed Oct. 4, 2006.

Abrams, Daniel et al., "Mask-Patterns Including Intentional Breaks," Response to Office Action filed Nov. 9, 2009, in U.S. Appl. No. 11/538,782, filed Oct. 4, 2006.

Abrams, Daniel et al., "Systems, Masks, and Methods for Manufacturable Masks," Nonfinal Office Action mailed Apr. 2, 2009, in U.S. Appl. No. 11/245,691, filed Oct. 6, 2005.

Abrams, Daniel et al., "Systems, Masks, and Methods for Manufacturable Masks," Response to Office Action filed Jul. 29, 2009, in U.S. Appl. No. 11/245,691, filed Oct. 6, 2005.

Abrams, Daniel et al., "Systems, Masks, and Methods for Photomasks Optimized with Approximate and Accurate Merit Functions," Nonfinal Office Action mailed May 11, 2009, in U.S. Appl. No. 11/539,601, filed Oct. 6, 2005.

Abrams, Daniel et al. "Systems, Masks, and Methods for Photomasks Optimized with Approximate and Accurate Merit Functions," Response to Office Action filed Nov. 9, 2009, in U.S. Appl. No. 11/539,601, filed Oct. 6, 2005.

Abrams, Daniel et al., "Fast Systems and Methods for Calculating Electromagnetic Fields Near Photomasks," Nonfinal Office Action mailed Feb. 13, 2007, in U.S. Appl. No. 11/245,714, filed Oct. 6, 2005, now abandoned.

Abrams, Daniel S., et al., "Systems, Masks, and Methods for Photolithography," Nonfinal Office Action mailed Mar. 19, 2009, in U.S. Appl. No. 11/531,673, filed Sep. 13, 2005.

Abrams, Daniel et al., "Technique for Determining a Mask Pattern Corresponding to a Photomask," Response to Nonfinal Office Action filed Aug. 27, 2009, in U.S. Appl. No. 11/674,130, filed Feb. 12, 2007.

Abrams, Daniel S., et al., "Systems, Masks, and Methods for Photolithography," Response to Nonfinal Office Action filed Aug. 13, 2009, in U.S. Appl. No. 11/531,673, filed Sep. 13, 2005.

Abrams, Daniels S., et al., "Systems, Masks, and Methods for Photolithography," Notice of Allowance mailed Oct. 2, 2009, in U.S. Appl. No. 11/531,673, filed Sep. 13, 2005.

Abrams, Daniel et al., "Method for Time-Evolving Rectilinear Contours Representing Photo Masks," Notice of Allowance mailed Sep. 22, 2009, 2009, in U.S. Appl. No. 11/674,133, filed Feb 12, 2007.

Abrams, Daniel et al., "Method for Time-Evolving Rectilinear Contours Representing Photo Masks," Restriction Requirement mailed Jan. 14, 2009, in U.S. Appl. No. 11/674,133, filed Feb 12, 2007.

* cited by examiner

LITHOGRAPHY VERIFICATION USING GUARD BANDS

CROSS-REFERENCE

This application claims the benefit of U.S. Provisional Application No. 60/723,320, filed Oct. 3, 2005, which is incorporated herein by reference in its entirety.

BACKGROUND OF THE INVENTION

1. Field of the Invention

The present invention relates to techniques for verifying lithographic processes that use photo-masks and semiconductor-manufacturing processes that use write devices.

2. Related Art

Lithography processing represents an essential technology for manufacturing Integrated Circuits (IC) and Micro Electro-Mechanical Systems (MEMS). Lithographic techniques are used to define patterns, geometries, features or shapes. (henceforth referred to as 'patterns') onto an integrated circuit die or semiconductor wafer or chips where the patterns are typically defined by a set of contours, lines, boundaries, edges or curves. (henceforth referred to as 'contours'), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photo-mask patterns and are accompanied by unwanted distortions and artifacts.

Techniques such as Optical Proximity Correction (OPC) attempt to improve resolution and/or a process window in a photolithography process by appropriately pre-distorting the photo-mask pattern such that the wafer pattern is printed more accurately. In addition, other techniques known as resolution enhancement technologies (RET) also modify the design of the photo-mask in order to improve photolithography.

A critical issue that arises when using OPC or RET is verifying that an intended photo-mask will print correctly on the wafer, without actually creating the photo-mask (which is an expensive process) or printing wafers in a manufacturing facility or fab (which is also expensive). In addition, there is also a need to determine the robustness of the photo-mask and/or the associated semiconductor-manufacturing process. For example, a manufacturer may be interested in exposure latitude and/or depth of focus (which define a process window). Software is sometimes used to verify suitability of a photo-mask or to estimate the process window by simulating what will actually print on a wafer (henceforth referred to as an estimated wafer pattern).

However, any such verification technique needs a way to determine what errors are acceptable, and what errors constitute a defect. Various methods are used for this purpose today. For example, so-called 'bridging' occurs when two features in an estimate of a printed wafer merge. This is generally considered to be a defect. Other approaches include measuring a critical dimension (CD) of a feature at a specific place in an estimated wafer pattern. Unfortunately, these existing approaches may not be systematic. As a consequence, the resulting verification may be incomplete with a negative impact on manufacturing yield and cost.

Hence what is needed are improved systems and methods to facilitate lithography verification.

SUMMARY OF THE INVENTION

One embodiment of the present invention provides a method for verifying a lithographic process. During the method, a set of guard bands are defined around a target pattern that is to be printed on a semiconductor die using a photo-mask in the lithographic process. An estimated pattern is calculated using a model of the lithographic process. This model of the lithographic process includes a mask pattern corresponding to the photo-mask and a model of an optical path. Then, whether or not positions of differences between the estimated pattern and the target pattern exceeded one or more guard bands in the set of guard bands is determined.

In some embodiments, a model of the lithographic process includes a photo-resist model.

In some embodiments, the set of guard bands correspond to tolerances associated with the target pattern.

In some embodiments, different regions in the target pattern have different guard bands in the set of guard bands. For example, the different regions may include corners, straight portions, angular portions, rectangular end portions, and/or transitional regions between any two respective regions. In some embodiments, regions including corners in the target pattern have a larger guard band than regions including straight portions in the target pattern.

In some embodiments, at least some of the guard bands in the set of guard bands are defined in accordance with user criteria and/or with topology of one or more regions in the target pattern. Furthermore the set of guard bands may be associated with features in the target pattern.

In some embodiments, a respective guard band in the set of guard bands overlaps a corresponding feature. For example, the features may include edges.

In some embodiments, the set of guard bands, target pattern, and estimated pattern include bitmap images and/or grayscale images. For those embodiments with bitmap images, the determining may include performing a logic operation (such as an exclusive OR or XOR) on the estimated pattern and the target pattern. And for these embodiments with grayscale images, the determining may be performed at sub-pixel resolution.

In some embodiments, the calculating and determining are performed over a range of process conditions in the lithographic process. Furthermore, in some embodiments a remedial action condition is asserted in accordance with the determined positions.

Another embodiment provides a computer system configured to execute instructions corresponding to at least some of the above-described operations.

Another embodiment provides a computer-program product for use in conjunction with the computer system.

Another embodiment provides a method for verifying a semiconductor-manufacturing process. During the method, a set of guard bands are defined around a target pattern that is to be printed on a semiconductor die using a write device in the semiconductor-manufacturing process. An estimated pattern is calculated using a model of the semiconductor-manufacturing process. This model of the semiconductor-manufacturing process includes a write pattern for the write device. Then, whether or not positions of differences between the estimated pattern and the target pattern exceeded one or more guard bands in the set of guard bands is determined.

Another embodiment provides a data file stored in a computer-readable memory. The data file includes first information corresponding to a pattern. This pattern is to be printed in a semiconductor-manufacturing process. In addition, the data file includes second information corresponding to a set of guard bands associated with the pattern.

In some embodiments, the pattern is to be printed on a semiconductor die using the write device in the semiconductor-manufacturing process or using the photo-mask in the semiconductor-manufacturing process.

In some embodiments, the pattern is mask pattern associated with a photo-mask. This photo-mask is to print a target pattern on a semiconductor die in the semiconductor-manufacturing process.

In some embodiments, the data file is compatible with formats including GDSII or Oasis.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings.

DETAILED DESCRIPTION OF THE INVENTION

Figure 1:
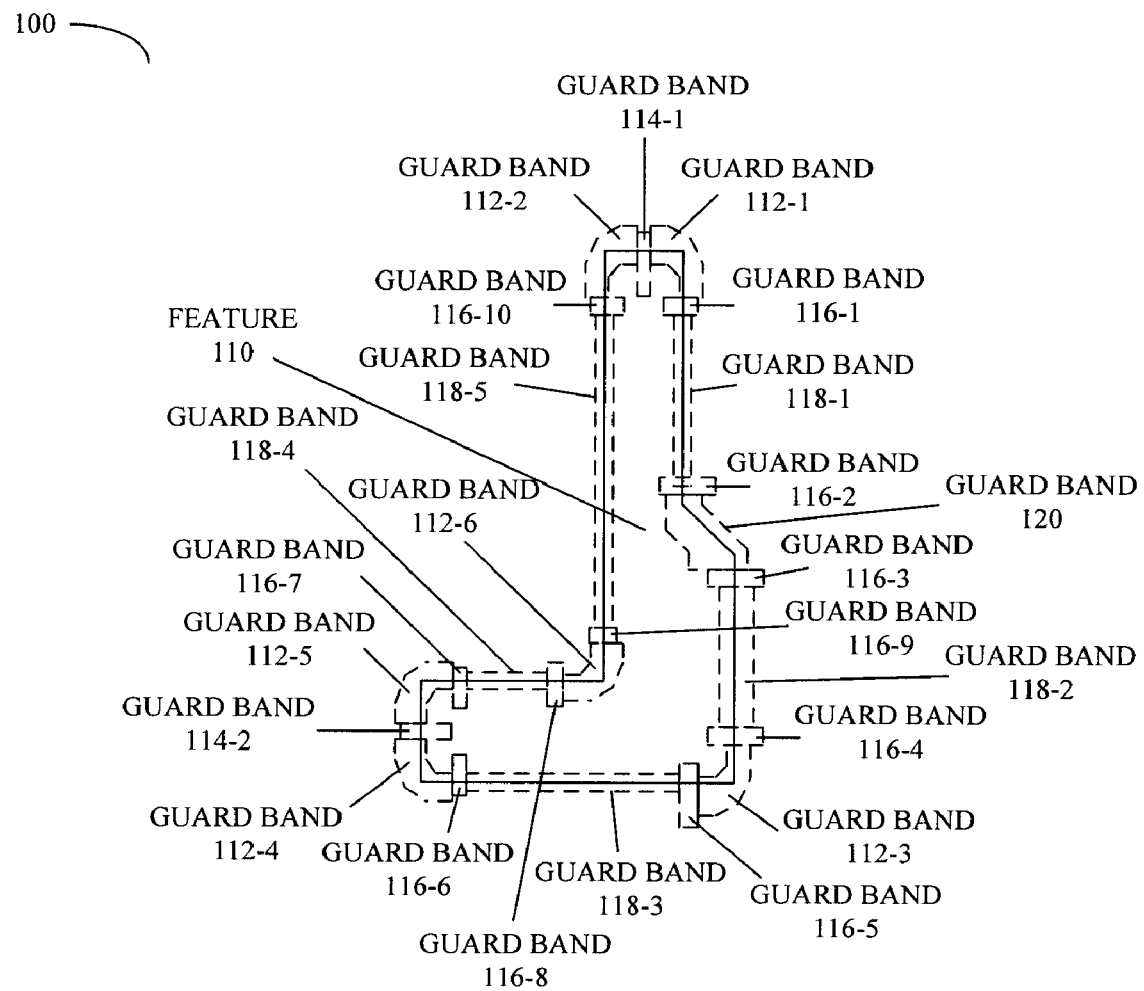
FIG. 1 is a block diagram illustrating a feature in a pattern and associated guard bands in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These systems and processes may be used to verify (photo-) lithographic processes and/or semiconductor-manufacturing processes. In particular, a set of guard bands may be defined around a target pattern that is to be printed. In some embodiments, this printing is to use a photo-mask in the lithographic process and/or a write device (such as a direct-write device or a laser writer) in the semiconductor-manufacturing process. An estimated pattern is calculated using a model of the lithographic process and/or a model of the semiconductor manufacturing process. For example, the model of the lithographic process may include a mask pattern corresponding to the photo-mask, a model of an optical path, and/or a photo-resist model. In addition, the model of the semiconductor-manufacturing process may include a write pattern for the write device. Then, whether or not positions of differences between the estimated pattern and the target pattern exceeded one or more guard bands in the set of guard bands is determined. Furthermore, the calculating of one or more estimated patterns and the determining of differences may be performed over a range of process conditions in the lithographic process and/or the semiconductor-manufacturing process to determine a process window.

In this way, deviations with respect to a set of tolerances may be determined and, if needed, a remedial action condition is asserted. For example, the mask pattern and/or the write pattern may be deemed unacceptable. In this case, the mask pattern and/or the write pattern may be rejected and/or modified to correct the problem. In addition, the differences that are determined may be classified in order to identify different types of errors or defects, and in particular, to separate less important or damaging defects from more important or damaging ones.

Different regions in the target pattern may have different guard bands in the set of guard bands. For example, the different regions may include corners, straight portions, angular portions, rectangular end portions, and/or transitional regions between any two respective regions. In some embodiments, regions including corners in the target pattern have a larger guard band than regions including straight portions in the target pattern. Note that at least some of the guard bands in the set of guard bands may be defined in accordance with user criteria and/or with topology of one or more regions in the target pattern. Furthermore the set of guard bands may be associated with features in the target pattern.

We now describe embodiments of a computer system, a method, and software for verify lithographic processes and/or semiconductor-manufacturing processes. FIG. 1 provides a block diagram illustrating a feature 110 in a pattern (such as a target pattern) and associated guard bands 112, 114, 116, 118, and 120 in accordance with an embodiment 100 of the present invention. The guard bands 112, 114, 116, 118, and 120 constitute a set of guard bands. These guard bands are defined around regions in the feature that are to be printed on a wafer. In particular, the different guard bands correspond to different types of regions in the feature 110. For example, the different types of regions may include corners (guard bands 112), rectangular end portions (guard bands 114), straight portions (guard bands 118), angular portions (guard bands 120), and/or transitional regions (guard bands 116) between any two respective regions.

Note that guard bands for the different types of regions may have different tolerances relative to the edge or contour of the feature 110. For example, guard bands 112 associated with corners in the feature 110 are larger than guard bands 118 associated with straight portions in the feature 110. For example, one embodiment may use a 193 nm light source and a 65 nm design, guard bands 118 associated with straight portions that are about 6 nm wide, indicating an acceptable range of +/−5% of the critical dimension (CD), and guard bands 112 associated with corner regions that are about 12 nm wide, indicating an acceptable range of +/−10% of the CD.

Other embodiments may use guard bands that have a width in the range of about 2 to 20 nm wide or any range subsumed therein, and/or guard bands that have a width in the range of about 5% to 100% of the CD or any range subsumed therein and/or guard bands associated with corner regions that have a width of in the range of about 1 to 3 times the width of guard bands associated with straight portions or any range subsumed therein. These are examples only and other embodiments could use smaller or larger guardbands, smaller or larger CDs, and different light sources. In addition, the guard bands 116 for the transitional regions may permit larger tolerances than the guard bands 118, but only for a short length along the side of the feature 110 relative to other guard bands. Thus, the guard bands 112, 114, 116, 118, and 120 may define areas where a difference (i.e., an error) may be tolerated (in particular, the area within the guard bands). For example, the feature 110 pattern may be thinner or wider within a guard band and not be considered an error. However, failure to print a portion of the feature 110 within an inner boundary of the guard bands or printing a portion of the feature 110 outside an outer boundary of the guard bands is considered an error.

Also note that the guard bands 112, 114, 116, 118, and 120 may overlap the edge or contour of the feature 110. Furthermore, as illustrated in FIG. 1, in some embodiments at least some of the guard bands overlap, such as guard band 116-2 and guard band 118-1.

The guard bands 112, 114, 116, 118, and/or 120 may be defined based on user criteria (such as a process window in the lithographic process and/or the semiconductor-manufacturing process) and/or with topology of one or more regions in the feature 110. For example, a user may define critical regions with tight tolerance in which the guard bands are narrow. In addition, a computer system may recognize the differing topology of line ends versus longer straight lines, and use different tolerances in each case. As noted previously, corners or regions near corners may also have different guard bands.

Once guard bands have been determined, a defect may be simply defined as a difference that is positioned outside of one or more of the guard band areas. As an example, consider features in a given target pattern as those that define areas where resist should be cleared, and the absence of such features in the given target pattern as those where photo-resist should remain. If the estimated pattern includes a location, outside of one or more of the guard-band areas where resist should not be cleared but resist is present, then this would constitute a defect. Similarly, if the estimated pattern includes a location outside one or more of the guard-band areas where resist should be cleared but is not cleared, then this would also constitute a defect.

In some embodiments, the set of guard bands, target pattern, and estimated pattern include bitmap images and/or grayscale images (in which the value of the various pixels indicates a distance to the edge or contour of the feature 110). For those embodiments with bitmap images, the determining of differences may include performing a logic operation (such as an exclusive OR or XOR) on the estimated pattern and the target pattern. In particular, removing those pixels that are also present in the guard band image leaves behind only those pixels that would constitute defects. Therefore, their presence or absence may be used to determine if the image of the estimated pattern is acceptable. And for these embodiments with grayscale images, the determining of differences and/or whether such an error or defect is outside the area defined by one or more guard bands may be performed at sub-pixel resolution.

The lithographic process used to print a wafer pattern that is to approximate a target pattern that includes guard bands may include a wide variety of process and/or optical conditions. For example, off-axis illumination, dipole illumination, quadropole illumination, quasar illumination, incoherent illumination, coherent illumination, and/or any arbitrary illumination aperture may be used. In addition, one or more light sources may include I line, g line, a wavelength of 193 nm, a wavelength of 248 nm, immersion, and/or any other optical lithography wavelength in air, water, or other fluid or gas. Furthermore, the mask patterns may correspond to photomasks that include polarizing regions, chrome regions, attenuated regions, phase-shifting regions, or attenuated phase shifting regions.

The semiconductor-manufacturing process may use a laser-writer or direct-write device. In these embodiments, the mask pattern (corresponding to the photo-mask) described above is not physically manifested. Instead, there is a write pattern that is to guide the writing of the direct-write device in order to print the target pattern on a wafer. Note that the lithographic process and/or the semiconductor-manufacturing process may include multiple exposures.

Note that in some embodiments the feature 110 in the pattern may include fewer or additional components, two or more components may be combined into a single component, and/or a position of one or more components (such as one of the guard bands 112, 114, 116, 118, and/or 120) may be changed.

Figure 2:
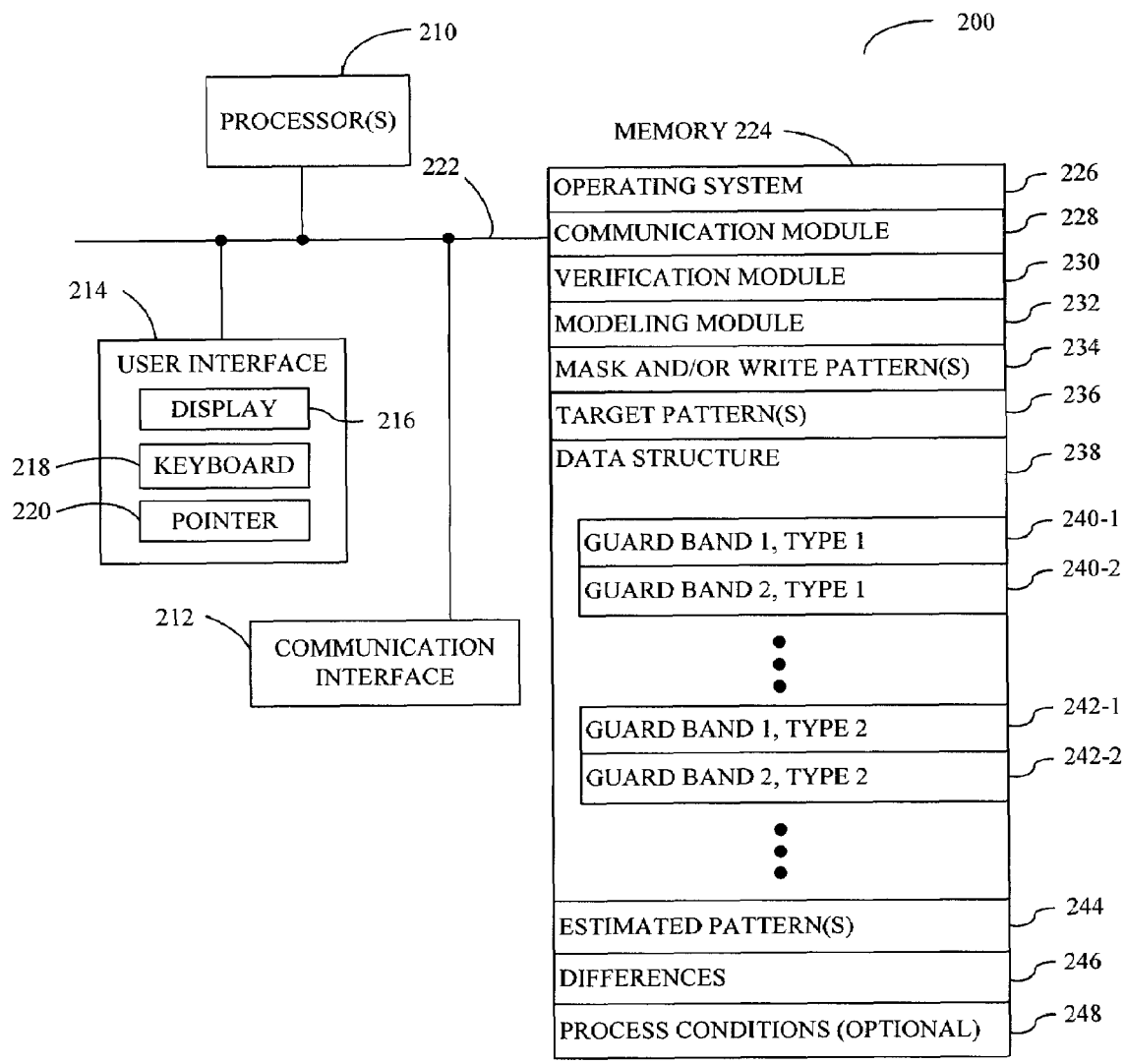
FIG. 2 is a block diagram illustrating a computer system in accordance with an embodiment of the present invention.

FIG. 2 provides a block diagram illustrating a computer system 200 in accordance with an embodiment of the present invention. The computer system 200 includes one or more processors 210, a communication interface 212, a user interface 214, and one or more signal lines 222 coupling these components together. Note that the one or more processing units 210 may support parallel processing and/or multi-threaded operation, the communication interface 212 may have a persistent communication connection, and the one or more signal lines 222 may constitute a communication bus. Moreover, the user interface 214 may include a display 216, a keyboard 218, and/or a pointer 220, such as a mouse.

Memory 224 in the computer system 200 may include volatile memory and/or non-volatile memory. More specifically, memory 224 may include ROM, RAM, EPROM, EEPROM, FLASH, one or more smart cards, one or more magnetic disc storage devices, and/or one or more optical storage devices. Memory 224 may store an operating system 226 that includes procedures (or a set of instructions) for handling various basic system services for performing hardware dependent tasks. The memory 224 may also store communications procedures (or a set of instructions) in a communication module 228. The communication procedures may be used for communicating with one or more computers, devices and/or servers, including computers, devices and/or servers that are remotely located with respect to the computer system 200.

Memory 224 may also include one or more program modules (or a set of instructions), including a verification module 230 (or a set of instructions) for verifying a lithographic process and/or a semiconductor-manufacturing process. In addition, memory 224 may include a modeling module 232 (or a set of instructions) for calculating estimated patterns. For example, the modeling module 232 may include a forward-optical model of an optical path that includes a mask pattern corresponding to a photo-mask at an object plane in order to determine an estimated pattern at an image plane. Such forward-optical models may include Fourier representations of the optical path.

In addition, in other embodiments, the modeling module is used to determine a mask pattern and/or a write pattern that correctly prints a wafer pattern as determined using the set of guard bands. For example, the determining of the mask pattern and/or the write pattern may use an inverse-optical calculation in which the desired printed pattern at an image plane of an optical path (such as that in a lithographic device) is used to determine the mask pattern (corresponding to a photo-mask) and/or a write pattern used at an object plane of the optical path.

Furthermore, memory 224 may include one or more mask and/or write patterns 234, one or more target patterns 236, one or more estimated patterns 244, one or more differences 246 between one or more estimated patterns and one or more target patterns, and/or optional process conditions. In addition, memory 224 may include a data structure 238 that includes information for different types of guard bands 240 and 242.

Instructions in the various modules in the memory 224 may be implemented in a high-level procedural language, an object-oriented programming language, and/or in an assembly or machine language. The programming language may be compiled or interpreted, i.e., configurable or configured to be executed by the one or more processing units 210.

Although the computer system 200 is illustrated as having a number of discrete components, FIG. 2 is intended to be a functional description of the various features that may be present in the computer system 200 rather than as a structural schematic of the embodiments described herein. In practice, and as recognized by those of ordinary skill in the art, the functions of the computer system 200 may be distributed over a large number of servers or computers, with various groups of the servers or computers performing particular subsets of the functions. In some embodiments, some or all of the functionality of the computer system 200 may be implemented in one or more ASICs and/or one or more digital signal processors DSPs.

Computer system 200 may include fewer components or additional components, two or more components may be combined into a single component, and/or a position of one or more components may be changed. In some embodiments the functionality of computer system 200 may be implemented more in hardware and less in software, or less in hardware and more in software, as is known in the art.

Figure 3:
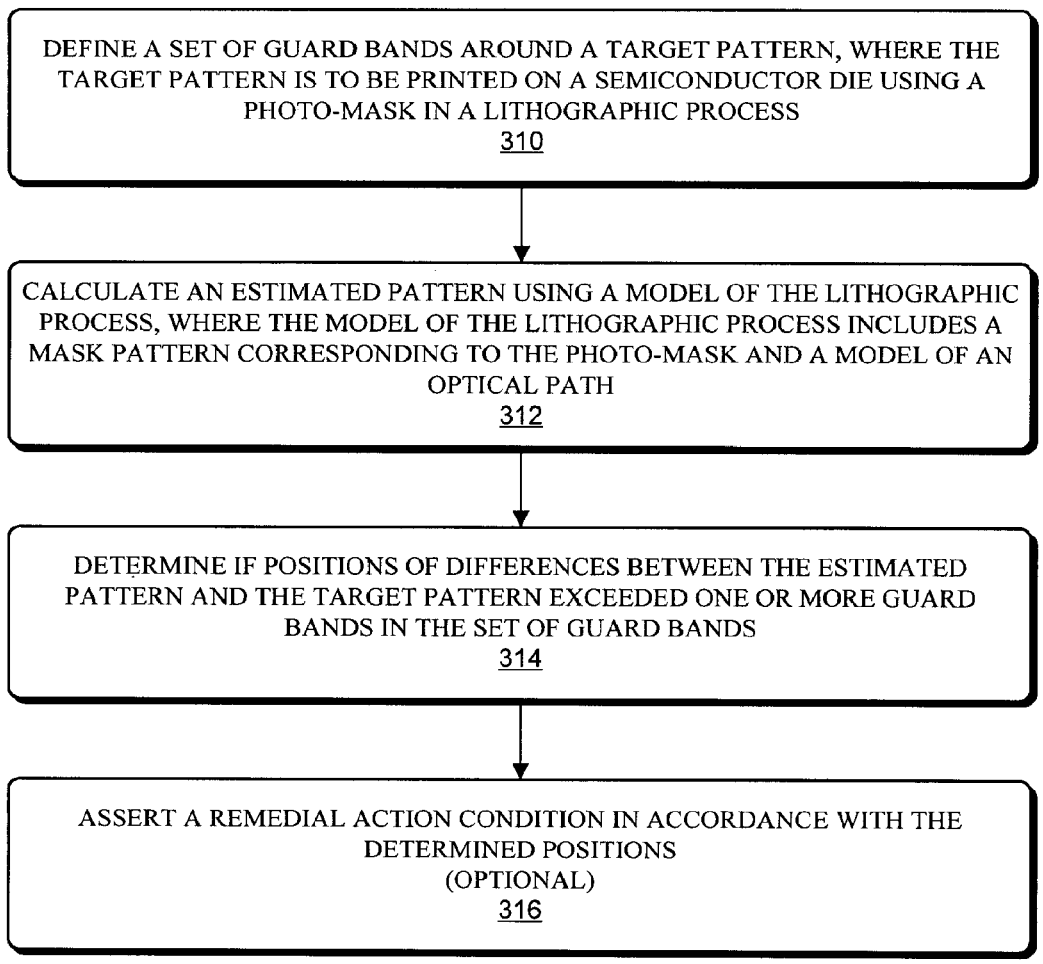
FIG. 3 is a flow chart illustrating a process for verifying a lithographic process in accordance with an embodiment of the present invention.

We now discuss methods for verifying a lithographic process and/or a semiconductor-manufacturing process. FIG. 3 provides a flow chart illustrating a process 300 for verifying a lithographic process in accordance with an embodiment of the present invention. During this process, a set of guard bands is defined around a target pattern (310). This target pattern is to be printed on a semiconductor die or wafer using a photo-mask in the lithographic process. Then, an estimated pattern is calculated using a model of the lithographic process (312). This model of the lithographic process includes a mask pattern corresponding to the photo-mask and a model of an optical path. Next, whether or not positions of differences between the estimated pattern and the target pattern exceed one or more guard bands in the set of guard bands is determined (314). In some embodiments, a remedial action condition is optionally asserted in accordance with the determined positions (316).

Figure 4:
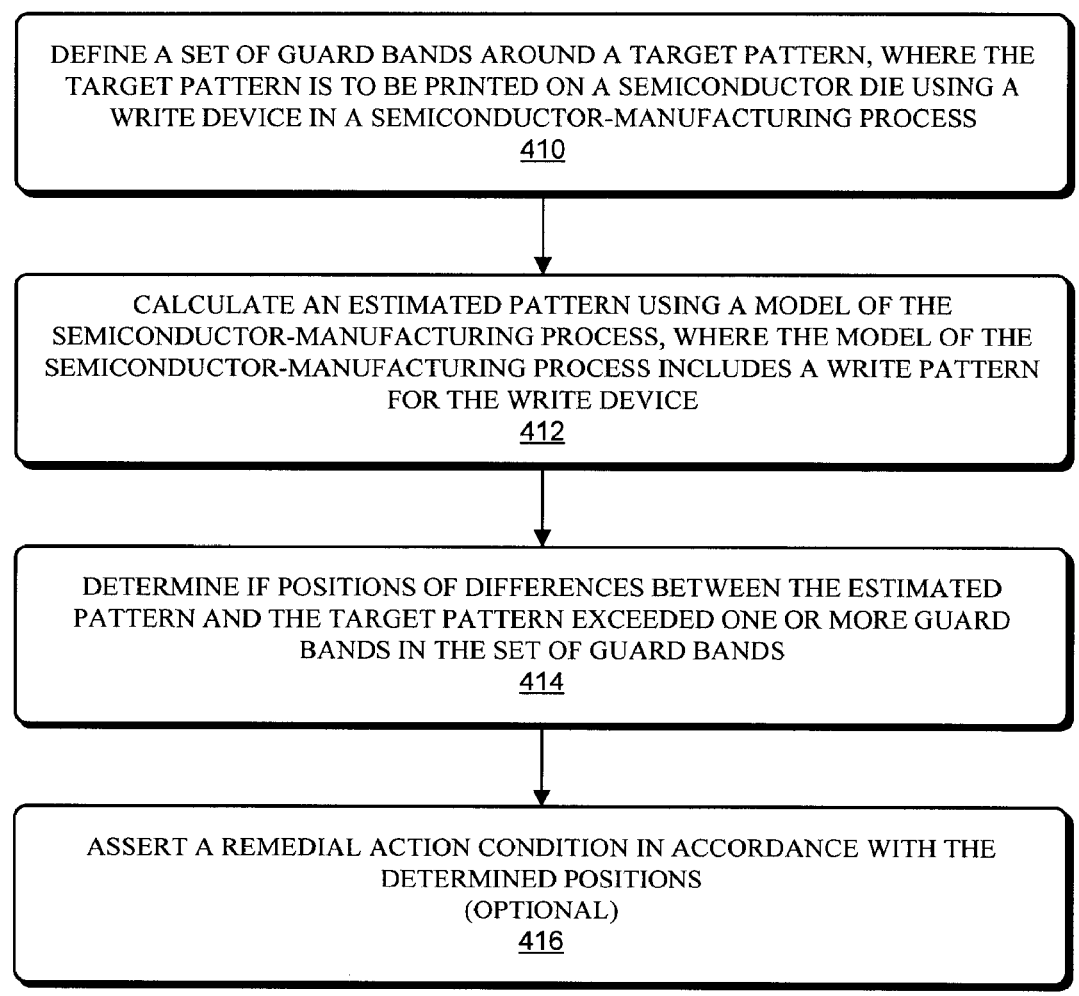
FIG. 4 is a flow chart illustrating a process for verifying a semiconductor-manufacturing process in accordance with an embodiment of the present invention.

FIG. 4 provides a flow chart illustrating a process 400 for verifying a semiconductor-manufacturing process in accordance with an embodiment of the present invention. During this process, a set of guard bands is defined around a target pattern (410). This target pattern is to be printed on a semiconductor die or wafer using a write device in the semiconductor-manufacturing process. Then, an estimated pattern is calculated using a model of the semiconductor-manufacturing process (412). This model of the semiconductor-manufacturing process includes a write pattern for the write device. Next, whether or not positions of differences between the estimated pattern and the target pattern exceed one or more guard bands in the set of guard bands is determined (414). In some embodiments, a remedial action condition is optionally asserted in accordance with the determined positions (416). Note that in some embodiments of the process 300 and/or the process 400 there may be additional or fewer operations, the order of the operations may be changed, and two or more operations may be combined into a single operation.

Figure 5:
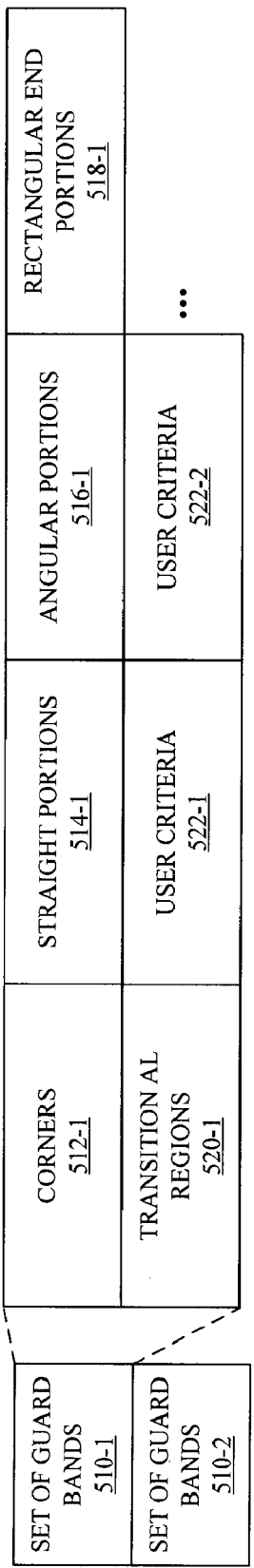
FIG. 5 is a block diagram illustrating a data structure in accordance with an embodiment of the present invention.

We now discuss data structures that may be used in the computer system 200 (FIG. 2). FIG. 5 provides a block diagram illustrating a data structure 500 in accordance with an embodiment of the present invention. This data structure may include sets of guard bands 510. For example, set of guard bands 510-1 may include guard bands for one or more corners 512-1, one or more straight portions 514-1, one or more angular portions 516-1, one or more rectangular end portions 518-1, and/or one or more transitional regions 520-1. In addition, there may be information for one or more user criteria 522.

Figure 6:
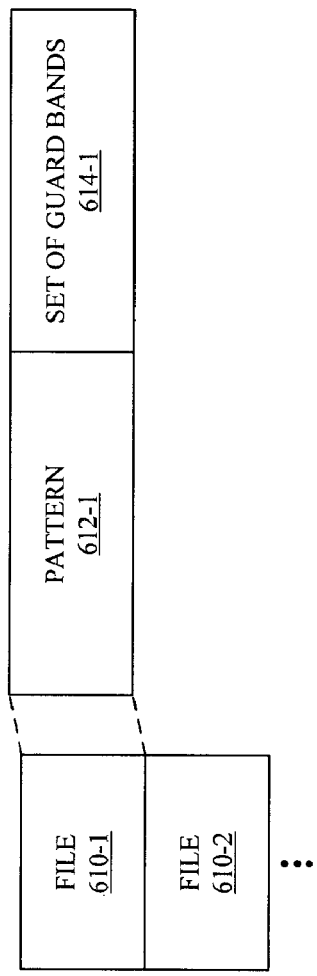
FIG. 6 is a block diagram illustrating a data structure in accordance with an embodiment of the present invention.

FIG. 6 provides a block diagram illustrating a data structure 600 in accordance with an embodiment of the present invention. This data structure may include files 610 for one or more patterns. For example, file 610-1 may include information for pattern 612-1 and an associated set of guard bands 614-1. This pattern may be intended to be printed in a lithographic process (for example, using a photo-mask) and/or a semiconductor-manufacturing process (for example, using a write device). Therefore, in some embodiments, the pattern 612-1 is a mask pattern associated with a photo-mask that is to print a target pattern on a semiconductor die in the lithographic process. And in some embodiments, the pattern 612-1 is associated with a write pattern that is to be used by a write device to print a target pattern on a semiconductor die in the semiconductor-manufacturing process. Note that the files 610 may be compatible with formats including GDSII or Oasis. Also note that that in some embodiments of the data structure 500 and/or of the data structure 600 there may be fewer or additional components, two or more components may be combined into a single component, and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims

What is claimed is:

1. A computer-implemented method for verifying a lithographic process, comprising:

defining a set of guard bands around a target pattern, wherein the target pattern is to be printed on a semiconductor die using a photo-mask in the lithographic process;

using a processor to calculate an estimated pattern using a model of the lithographic process, wherein the model of the lithographic process includes a mask pattern corresponding to the photo-mask and a model of an optical path, wherein an inverse optical calculation was used to determine the mask pattern at an object plane in the optical path based at least in part on the target pattern at an image plane in the optical path and the model of the optical path, and wherein the model of the optical path includes information in addition to a magnification of the optical path; and determining if positions of differences between the estimated pattern and the target pattern exceeded one or more guard bands in the set of guard bands.

2. The method of claim 1, wherein the model of the lithographic process includes a photo-resist model.

3. The method of claim 1, wherein the set of guard bands correspond to tolerances associated with the target pattern.

4. The method of claim 1, wherein different regions in the target pattern have different guard bands in the set of guard bands.

5. The method of claim 4, wherein the different regions include corners, straight portions, angular portions, rectangular end portions, and transitional regions between any two respective regions.

6. The method of claim 4, wherein regions including corners in the target pattern have a larger guard band than regions including straight portions in the target pattern.

7. The method of claim 1, wherein at least some of the guard bands in the set of guard bands are defined in accordance with user criteria.

8. The method of claim 1, wherein at least some of the guard bands in the set of guard bands are defined in accordance with topology of one or more regions in the target pattern.

9. The method of claim 1, wherein the set of guard bands are associated with features in the target pattern.

10. The method of claim 9, wherein a respective guard band in the set of guard bands overlaps a corresponding feature.

11. The method of claim 9, wherein the features include edges.

12. The method of claim 1, wherein the set of guard bands, target pattern, and estimated pattern include bitmap images.

13. The method of claim 12, wherein the determining includes performing a logic operation on the estimated pattern and the target pattern.

14. The method of claim 13, wherein the logic operation includes an exclusive OR (XOR) operation.

15. The method of claim 1, wherein the set of guard bands, target pattern, and estimated pattern include grayscale images.

16. The method of claim 15, wherein the determining is performed at sub-pixel resolution.

17. The method of claim 1, wherein the calculating and determining are performed over a range of process conditions in the lithographic process.

18. The method of claim 1, further comprising asserting a remedial action condition in accordance with the determined positions.

19. A computer-program product for use in conjunction with a computer system, the computer-program product comprising a computer-readable storage medium and a computer-program mechanism embedded therein for verifying a lithographic process, the computer-program mechanism including:

instructions for defining a set of guard bands wound a target pattern, wherein the target pattern is to be printed on a semiconductor die using a photo-mask in the lithographic process;

instructions for calculating an estimated pattern using a model of the lithographic process, wherein the model, of the lithographic process includes a mask pattern corresponding to the photo-mask and a model of an optical path, wherein an inverse optical calculation was used to determine the mask pattern at an object plane in the optical path based at least in part on the target pattern at an image plane in the optical path and the model of the optical path, and wherein the model of the optical path includes information in addition to a magnification of the optical path; and instructions for determining if positions of differences between the estimated pattern and the target pattern exceeded one or more guard bands in the set of guard bands.

20. A computer system, comprising:

at least one processor;

at least one memory; and at least one program module, the program module stored in the memory and configured to be executed by the processor, wherein at least the program module is for verifying a lithographic process, at least the program module including:

instructions for defining a set of guard bands around a target pattern, wherein the target pattern is to be printed on a semiconductor die using a photo-mask in the lithographic process;

instructions for calculating an estimated pattern using a model of the lithographic process, wherein the model of the lithographic process includes a mask pattern corresponding to the photo-mask and a model of an optical path, wherein an inverse optical calculation was used to determine the mask pattern at an object plane in the optical path based at least in part on the target pattern at an image plane in the optical path and the model of the optical path, and wherein the model of the optical path includes information in addition to a magnification of the optical path; and instructions for determining if positions of differences between the estimated pattern and the target pattern exceeded one or more guard bands in the set of guard bands.

21. A computer system, comprising:

means for computing;

means for storing; and at least one program module mechanism, the program module mechanism stored in at least the means for storing and configured to be executed by at least the means for computing, wherein at least the program module mechanism is for verifying a lithographic process, at least the program module mechanism including:

instructions for defining a set of guard bands around a target pattern, wherein the target pattern is to be printed on a semiconductor die using a photo-mask in the lithographic process;

instructions for calculating an estimated pattern using a model of the lithographic process, wherein the model of the lithographic process includes a mask pattern corresponding to the photo-mask and a model of an optical path, wherein an inverse optical calculation was used to determine the mask pattern at an object plane in the optical path based at least in part on the target pattern at an image plane in the optical path and the model of the optical path, and wherein the model of the optical path includes information in addition to a magnification of the optical path; and instructions for determining if positions of differences between the estimated pattern and the target pattern exceeded one or more guard bands in the set of guard bands.

22. A computer-implemented method for verifying a semiconductor-manufacturing process, comprising:

defining a set of guard bands around a target pattern, wherein the target pattern is to be printed on a semiconductor die using a write device in the semiconductor-manufacturing process;

using a processor to calculate an estimated pattern using a model of the semiconductor-manufacturing process, wherein the model of the semiconductor-manufacturing process includes a write pattern for the write device, wherein an inverse optical calculation was used to determine the write pattern at an object plane of the write device based at least in pad on the target pattern at an image plane in the write device and the model of the semiconductor-manufacturing process, and wherein the model of the optical path includes information in addition to a magnification of the optical path; and determining if positions of differences between the estimated pattern and the target pattern exceeded one or more guard bands in the set of guard bands.

* * * * *